(12) United States Patent
Budach

(10) Patent No.: US 8,316,698 B2
(45) Date of Patent: Nov. 27, 2012

(54) DETERMINING A REPAIRING FORM OF A DEFECT AT OR CLOSE TO AN EDGE OF A SUBSTRATE OF A PHOTO MASK

(75) Inventor: Michael Budach, Hanau (DE)

(73) Assignee: NaWoTec GmbH, Rossdorf (DE)

( * ) Notice: Subject to any disclaimer, the term of this patent is extended or adjusted under 35 U.S.C. 154(b) by 395 days.

(21) Appl. No.: 12/640,853

(22) Filed: Dec. 17, 2009

(65) Prior Publication Data

US 2010/0154521 A1 Jun. 24, 2010

Related U.S. Application Data

(60) Provisional application No. 61/140,224, filed on Dec. 23, 2008.

(30) Foreign Application Priority Data

Dec. 23, 2008 (DE) .......................... 10 2008 062 928

(51) Int. Cl.
*G01B 5/28* (2006.01)

(52) U.S. Cl. ................ 73/105; 73/862.634; 73/862.639; 116/275

(58) Field of Classification Search ..................... 73/105, 73/862.634, 862.639; 116/275
See application file for complete search history.

(56) References Cited

U.S. PATENT DOCUMENTS

| 6,335,129 | B1 | 1/2002 | Asano et al. |
| 6,555,277 | B1 | 4/2003 | Chen et al. |
| 2002/0096635 | A1 | 7/2002 | Takaoka et al. |
| 2003/0104288 | A1 | 6/2003 | Pang et al. |
| 2004/0121069 | A1* | 6/2004 | Ferranti et al. ................ 427/140 |
| 2004/0151991 | A1* | 8/2004 | Stewart et al. .................... 430/5 |
| 2007/0208533 | A1 | 9/2007 | Dahlen et al. |
| 2008/0078229 | A1 | 4/2008 | Mancevski et al. |
| 2008/0131792 | A1 | 6/2008 | Takaoka et al. |

\* cited by examiner

*Primary Examiner* — Hezron E Williams
*Assistant Examiner* — Rodney T Frank
(74) *Attorney, Agent, or Firm* — Meyertons Hood Kivlin Kowert & Goetzel, P.C.; Jeffrey C. Hood; Joel L. Stevens

(57) ABSTRACT

Determining a repairing form of a defect at or close to an edge of a substrate. The defect may be scanned with a scanning probe microscope to determine a three-dimensional contour of the defect. The defect may be scanned with a scanning particle microscope to determine the shape of the at least one edge of the substrate. The repairing form of the defect may be determined from a combination of the three-dimensional contour and the shape of the at least one edge.

18 Claims, 8 Drawing Sheets

Fig. 4
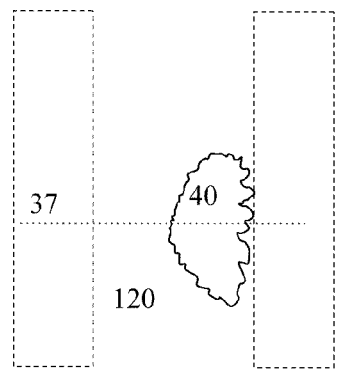
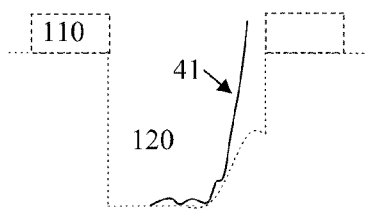
Fig. 5
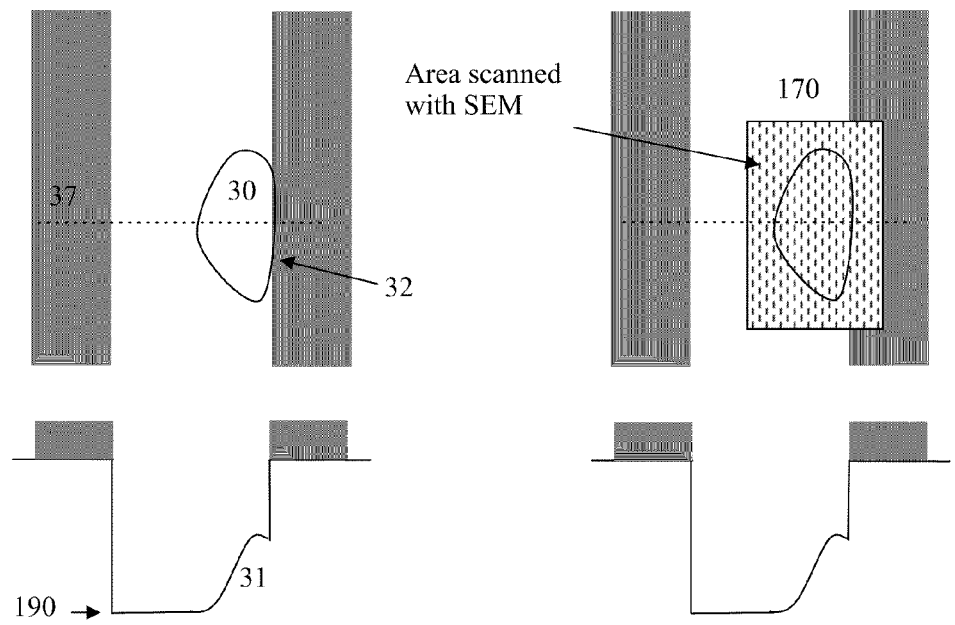

DETERMINING A REPAIRING FORM OF A DEFECT AT OR CLOSE TO AN EDGE OF A SUBSTRATE OF A PHOTO MASK

PRIORITY CLAIM

This application claims benefit of priority of U.S. provisional application Ser. No. 61/140,224, titled "Procedure For Determining A Repairing Form Of A Defect At Or In Close Range Of A Substrate Of A Photo Mask", filed Dec. 23, 2008, whose inventor is Michael Budach and which is hereby incorporated by reference in its entirety as though fully and completely set forth herein.

This application also claims benefit of priority of German application no. DE 10 2008 062 928.6-51 titled "Method to Determine a Repairing Form of a Defect at or Close to an Edge of a Substrate of a Photomask", filed Dec. 23, 2008, whose inventor is Michael Budach and which is hereby incorporated by reference in its entirety as though fully and completely set forth herein.

TECHNICAL FIELD

The present invention relates to a method for determining a repairing form of a defect at or close to an edge of a substrate of a photomask.

DESCRIPTION OF THE RELATED ART

As a result of the steadily increasing integration density in the semiconductor industry, photolithography masks have to image smaller and smaller structures. Thus, the manufacturing of photomasks is getting more and more complex and accordingly, more and more expensive as well. The diminishing structure size of photomasks leads to the occurrence of new, additional errors or defects on the photomasks. At the same time, the increasing effort for manufacturing of photomasks with smaller and smaller structures and the involved cost pressure lead to the effect that defects occurring at the mask manufacturing have to be repaired in order to avoid an expensive remanufacturing process. The applications of the applicant DE 103 38 019 A1 and EP 1 587 128 A1 disclose methods for repairing defective surface structures on photomasks.

Before defects on photomasks can be repaired, the defects have to be localized. This is done by optical inspection and by imaging with a particle beam (ions or electrons) from a FIB (focused ion beam) scanning microscope or a scanning electron microscope (SEM). When using an electron beam, the electrons released from the investigated surface of the photomasks are used as back scattering and secondary electrons are used to generate an image of the surface of the photomask. When using a focused ion beam, the secondary ions released from the substrate surface provide an image of the composition of the investigated surface (SIMS, Secondary Ion Mass Spectroscopy).

This kind of localization of a defect using an electron beam works as long as the substrate of the investigated surface and the defect have materials which have significantly different emission behaviour with respect to back scattering and/or secondary electrons. Similarly, when using an ion beam, the composition of the secondary ions from the substrate and from the defect has to be different in order to generate sufficient contrast.

In order to generate smaller and smaller structures, photomasks which change the phase of the light (so-called phase shift photomasks) are becoming more and more important. When using this type of mask, apart from the structures on the surface of the substrate, the substrate of the photomask itself is etched. Usually, the substrate of the photomask comprises quartz. However, when removing substrate material from the photomask, it may occur that—as is shown in FIG. 1—substrate material remains at positions at where it should be removed, so that so-called "quartz bumps" are generated. However, in some cases, it may occur that at some positions too much substrate material is removed, which results in the generation of holes or so-called "quartz divots" (See also FIG. 1). In these cases, the substrate material and the defect are made of the same material at these defects, and thus, this type of error cannot be precisely imaged with the aid of an ion beam or an electron beam.

In order to repair photomask defects of the described type, e.g., in the case of a quartz bump, the defect is irradiated with a particle beam and, in some cases, an etching gas is additionally provided in order to remove excessive substrate material. Missing material is also provided with the aid of a particle beam using an appropriate deposition gas at the locations of the defect. The repairing processes have to be controlled according to the topography of the defect, so that repaired locations have essentially a planar surface which is at the same level as the substrate surrounding the defect.

Thus, it is an essential prerequisite for the repairing of these defects to know the three-dimensional contour of the defect. As described above, the topography of these defects cannot be determined with sufficient accuracy with a scanning electron microscope (SEM) or with a FIB scanning microscope.

An atomic force microscope (AFM) can be used to measure the contour of the defect. In this context, the usage of an AFM is, as one example, described in the article "Advancements in Focused Ion Beam Repair of Alternating Photo Masks" (by Joshua Lessing, Tod Robinson, Troy Morrison and Theresa Holtermann, edited in the proceedings of SPIE, Vol. 5256, 23rd Annual BACUS Symposium on Photomask Technology, edited by Kurt R. Kimmel, Wolfgang Staud, pages 1208-1221). Furthermore, the US application US 2004/0121069 A1 discloses the use of an AFM to determine the contours of the above described photomask defects.

As depicted in FIG. 1, the usage of a scanning or screening AFM works well with isolated defects. However, the usage of an AFM leads to problems when the surface structure to be imaged exceeds a certain aspect ratio, i.e. the ratio of the depth or height, respectively, of a structure to its smallest lateral extension. This applies in particular at or close to an edge of a surface structure of the substrate of the photomask. In this case, AFMs have the principal characteristic to not exactly reproduce the contours of the described defects, since the diameter of the scanning tip of these devices is not significantly smaller than the structures to be imaged. This principal measurement problem cannot be completely removed by the mathematical operations described in the article "Algorithms for Scanned Probe Microscope Image Simulation and Tip Estimation" by J. S. Villarubia, published in J. Res. Natl. Inst. Stand. Technol. 102, 425 (1997).

Accordingly, improvements in determination of defects are desired.

SUMMARY OF THE INVENTION

Various embodiments are presented of a system and method for determining a repairing form of a defect at or close to an edge of a substrate of a photomask.

According to a first embodiment of the invention, this problem is solved by a method including scanning the defects with a scanning probe microscope to determine a three-dimensional contour of the defect and scanning the defect with a scanning particle microscope to determine the shape of the at least one edge of the substrate and to determine a repairing form of the defect from a combination of the three-dimensional contour and the shape of the at least one edge.

In this context, the expression "close to an edge" refers to the diameter of the tip of an AFM with respect to the height of the edge. A defect of a substrate or a structure of a photomask is not located close to an edge of the substrate or of the structure if the three-dimensional contour of the defect can be determined with the aid of an AFM without occurrence of the above described measurement problems.

In an embodiment of the invention, a first scan of the area to be repaired can be performed with a scanning probe microscope and a second scan of the area to be repaired can be performed with a scanning particle microscope. Then, the repairing form can be determined from the first and the second scan, where the repairing form is still reduced along the edge, so that the repairing form on which the repairing is finally based has a small distance to the edge.

Using the determination of the extent of a defect along an edge of the photomask based on scanning particle microscope scan data, the measurement problems of the AFM which arise with AFMs in this area are avoided. Thus, the boundary region between the defect and an edge of the substrate of the photomask can be detected with an enhanced accuracy compared to the prior art. This is particularly beneficial since, when repairing defects, the particle beam of a scanning particle microscope leads to an increased emission of secondary electrons at the edges, which may, for example, lead to the so-called "riverbedding" (see FIG. 3). In embodiments described herein, the method does not cause any additional experimental effort since a particle beam apparatus is in any case needed for the location and for the repairing of the defect.

In one embodiment, the combination of the three-dimensional contour and the shape of the at least one edge comprises the formation of an intersection of the three-dimensional contour and the shape of the edge.

In one embodiment, the scanning probe microscope comprises a force microscope and the scanning particle microscope comprises a scanning electron microscope.

In one embodiment, the shape of the edge is determined from topography contrast data and/or material contrast data of the scanning particle microscope scan.

In one embodiment, the intersection is determined by aligning the scanning probe microscope scan with the shape determined from the scanning particle microscope scan and by cutting the data of the scanning probe microscope scan with this edge.

In one embodiment, the repairing form comprises coordinates of the defect in a plane of its maximum extension which is perpendicular to the particle beam direction and a particle beam dose for repairing the defect.

In one embodiment, the repairing form is divided in a number of discrete points, wherein each point comprises a particle beam dose which is determined from by the data of the scanning probe microscope scan.

In one embodiment, the particle beam dose of the individual points of the repairing form is determined by an interpolation of several points of the scanning probe microscope scan.

In one embodiment, the repairing form of the defect along at least one edge of the photomask keeps at least a minimal distance away from the photomask. This ensures that no highly defective particle beam dose is used for the repairing of the photomask. Additionally, a defined distance to an edge avoids enhanced emission of secondary electrons when repairing this area of the defect, so that the problems according to this context are avoided (see FIG. 3).

In one embodiment, the repairing form of the defect projects at least a minimal length beyond the photomask along at least one edge. This approach ensures that no relic of the defect remains along an edge when repairing the photomask.

In an embodiment, a repairing form according to one of the above-mentioned embodiments is used for repairing a photomask.

In an embodiment, an apparatus for determining a repairing form of a defect at or close to an edge of a substrate of a photomask comprises at least a scanning probe microscope to scan the defect and to transmit scanned data, at least a scanning particle microscope to scan the defect and to transmit scanned data, and at least a data processing unit which determines a three-dimensional contour of the defect from the data of the scanning probe microscope scan and a shape of the at least one edge of the substrate from the data of the scanning particle microscope scan, and the repairing form of the defect from a combination of the three-dimensional contour and the shape of the at least one edge.

Further embodiments of the inventive method and of the inventive apparatus are provided herein and in the claims.

SHORT DESCRIPTION OF THE DRAWINGS

In the following detailed description presently preferred embodiments of the invention are described with reference to the drawings, wherein:

FIG. 4 shows a schematic representation of a three-dimensional contour of the defect in the plane of the largest extension which is perpendicular to the particle beam direction as it is determined from data of the AFM scan (upper partial image) and the lower partial image represents a cross-section, according to one embodiment;

Figure 2:
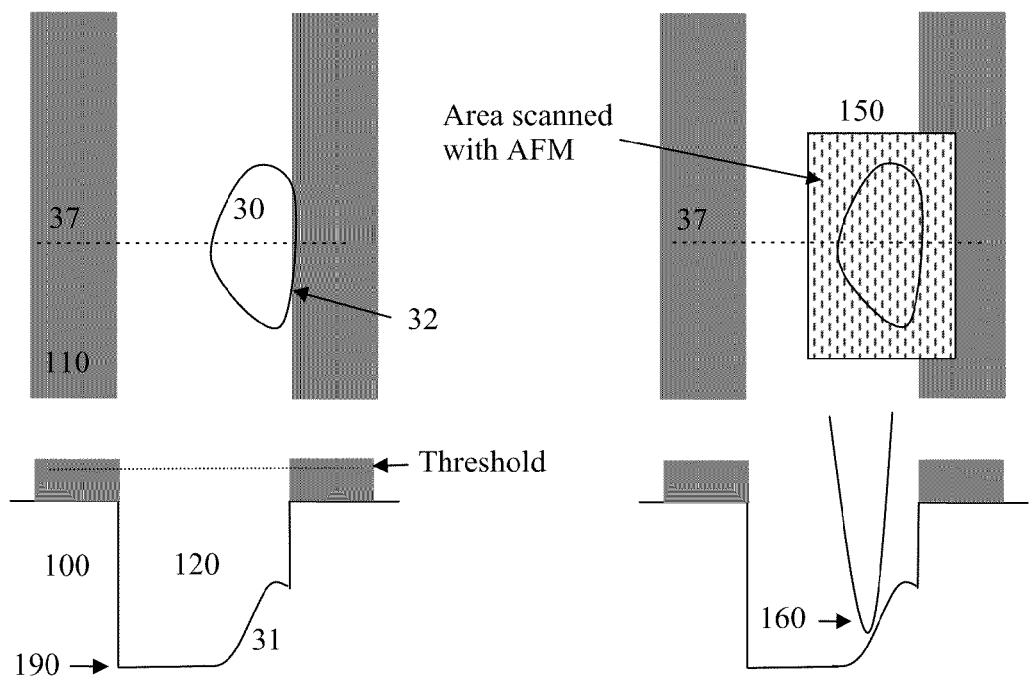
FIG. 2 shows, in the left upper partial image, a schematic representation of a photomask defect in top view which extends along an edge of the photomask as well as an area scanned with an AFM (upper right partial image) and each of the lower partial images represents cross-sections along the lines marked as dashed lines, according to one embodiment.
Figure 6:
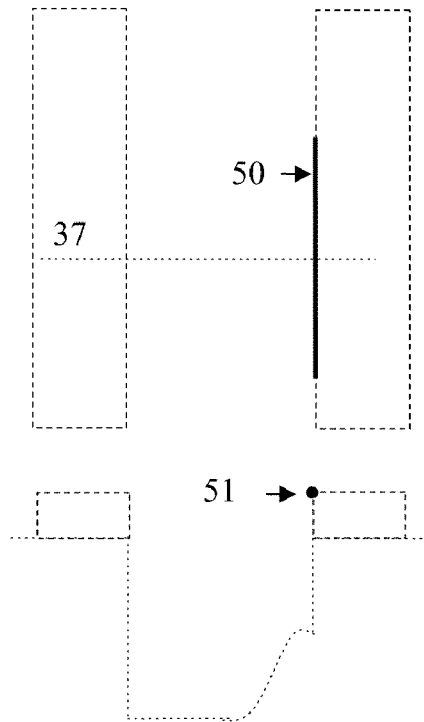
Figure 7:
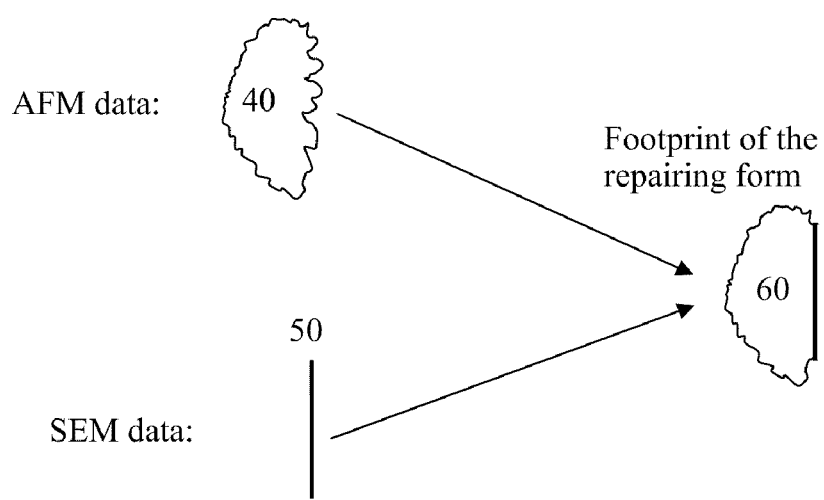
Figure 8:
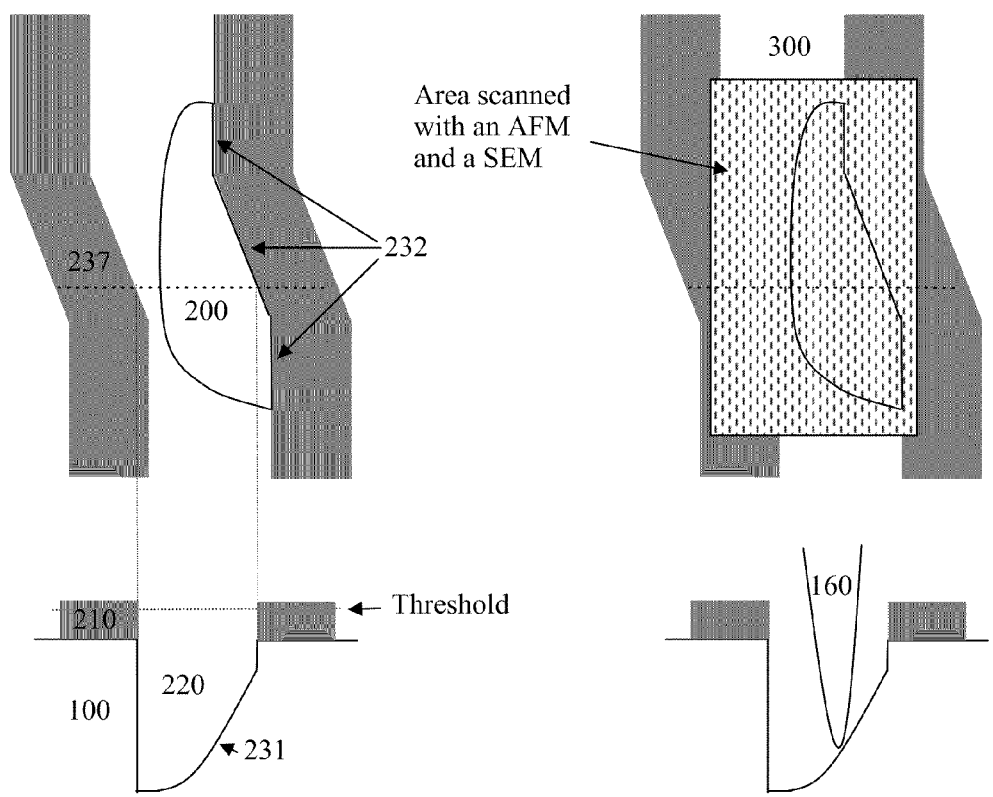
Figure 9:
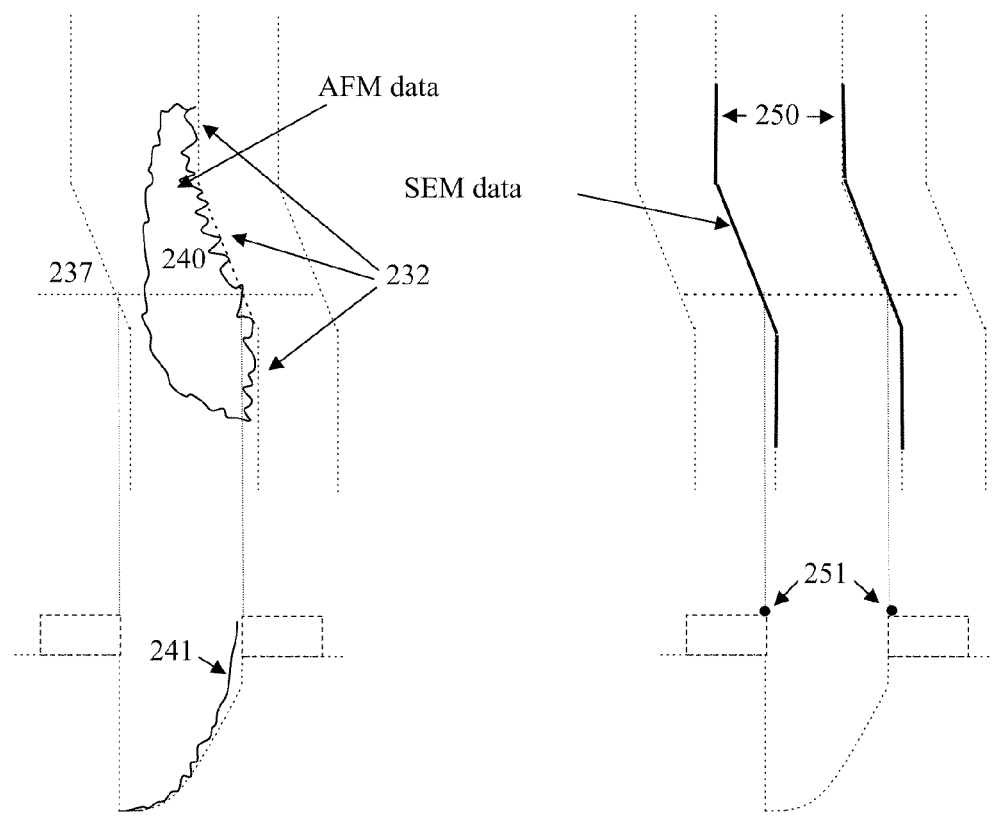
Figure 10:
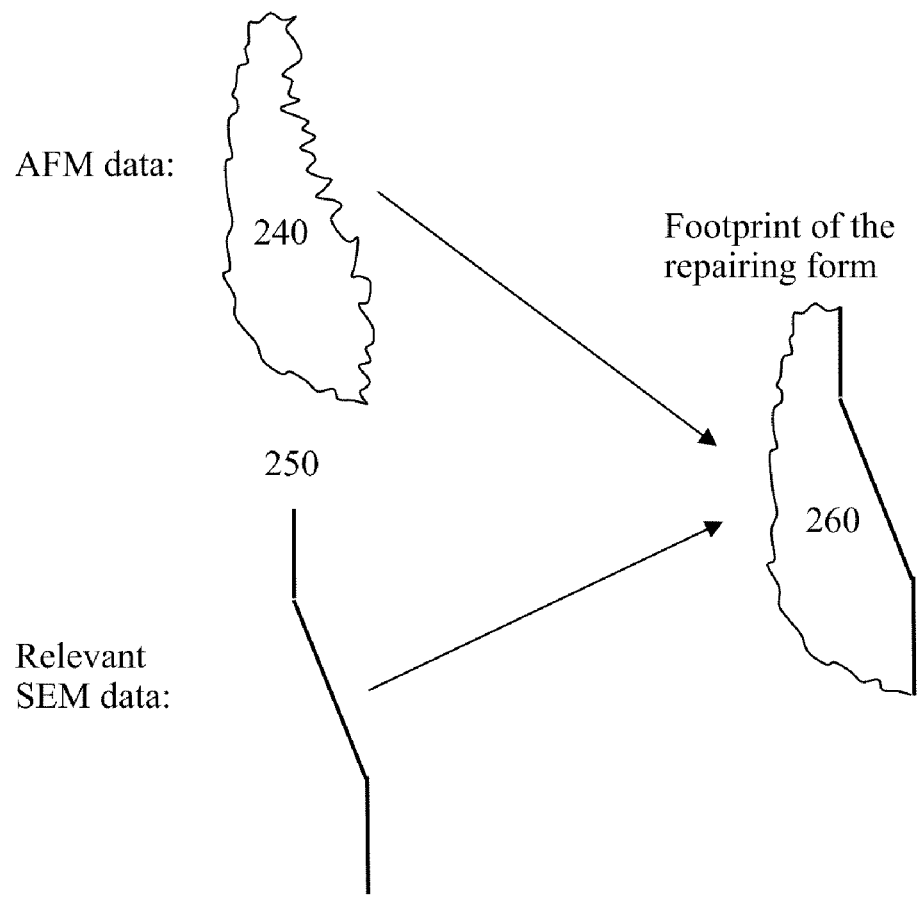
Figure 11:
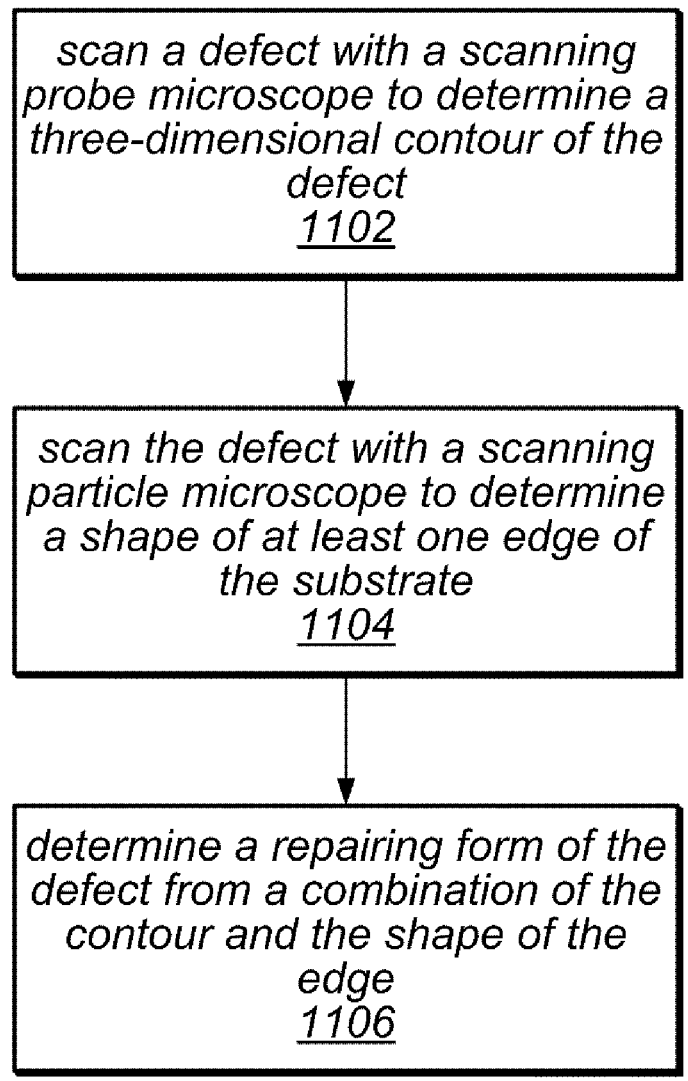

FIG. 5 repeats FIG. 2 with the difference that the area scanned with a SEM is now represented above the defect, according to one embodiment;

FIG. 6 shows a schematic representation with respect to the edge shape determined from the data of the SEM scan over the scanned area (upper partial image) and the lower partial images show a cross-section of the respective edge shape, according to one embodiment;

FIG. 7 shows a schematic representation of the footprint of the repairing form of the defect in the plane of the largest extension which is perpendicular to the electron beam direction, where footprint is determined from the three-dimensional contour and the shape of the edge, according to one embodiment;

FIG. 8 repeats FIG. 2 with another defect, an angled edge structure and another area scanned by the AFM and the SEM, according to one embodiment;

FIG. 9 shows a schematic representation of the three-dimensional contour of the defect in the plane of the largest extension which is perpendicular to the electron beam direction (left upper partial image) and a schematic representation of the edge shape (upper right partial image) as well as cross-sections at the marked positions (lower partial images), according to one embodiment;

FIG. 10 shows a schematic representation of the footprint of the repairing form of the defect in the plane of the largest extension which is perpendicular to the particle beam direction as it has been determined from the three-dimensional contour and the intersection of the three-dimensional contour with the edge shape, according to one embodiment; and FIG. 11 is a flowchart diagram illustrating one embodiment of a method for determining a repairing form of a defect at or close to an edge of a substrate of a photomask.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Terms

The following is a glossary of terms used in the present application:

Memory Medium—Any of various types of memory devices or storage devices. The term "memory medium" is intended to include an installation medium, e.g., a CD-ROM, floppy disks, or tape device; a computer system memory or random access memory such as DRAM, DDR RAM, SRAM, EDO RAM, Rambus RAM, etc.; or a non-volatile memory such as a magnetic media, e.g., a hard drive, or optical storage. The memory medium may comprise other types of memory as well, or combinations thereof. In addition, the memory medium may be located in a first computer in which the programs are executed, and/or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

In the following, preferred embodiments of the inventive method and of the inventive apparatus are described in detail. FIGS. 1-9

Figure 1:
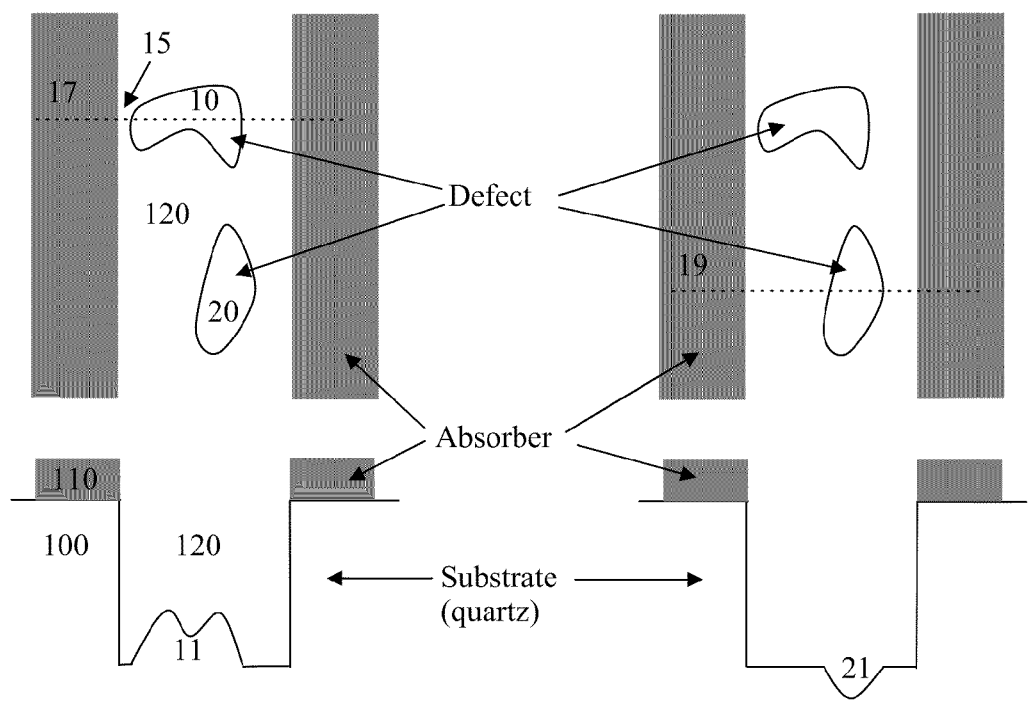
FIG. 1 shows a schematic representation of photomask defects in top view (upper partial images) and cross-sections at the positions of the dashed lines (lower partial images) which are isolated from an edge of the photomask, according to one embodiment.

FIG. 1 shows a schematic cut-away of a photomask influencing the phase of the light. The two upper partial images represent a top view and the two lower partial images represent cross-sections perpendicular to the dashed lines 17, 19 of the upper partial images. In this embodiment, the substrate 100 of the photomask may comprise or consist of quartz. However, the method described in the following in detail can also be used by all substrate materials having preferable characteristics for the applied wavelength of the optical radiation. In order to change the phase of the light used for exposure, the substrate 100 may have a recess 120 in the quartz substrate 100 between two absorbing structures 110, where its depth correlates with the wavelength of the applied light exposure. In the embodiment of FIG. 1 as well as in the following Figures, the light-absorbing structures 110 comprise chromium. Other absorbing materials, such as aluminum can also be used. Furthermore, the invention can also be used by pure phase shaping masks where the structure only consists of elevation profiles and thus does not have any absorbing materials.

In FIG. 1, the depressed area 120 of the substrate 100 of the photomask comprises two errors or defects 10, 20. As can be seen from the lower left partial image, the defect 10 represents a so-called "quartz bump", i.e. an area where not enough substrate material 100 has been removed. The lower left partial image shows a sectional drawing 11 through the defect 10 along the dashed line 17. An AFM can well scan the three-dimensional contour of the defect 10 except for the edge 15 of the substrate 100.

In the area of the defect 20, the removal of the substrate material 100 was larger than intended which results in the formation of an additional recess or a "quartz divot" in the lower substrate area 120. The lower right partial image presents a sectional view 21 of the defect 20 at the position indicated by the dashed line 19 of the upper right partial image. Since all sides of the defect 20 are accessible to an AFM scan, its three-dimensional contour can be determined with this device with accuracy sufficient for repairing the defect 20.

Like FIG. 1, FIG. 2 represents a sectional view of a photomask influencing the phase of the optical radiation. As can be seen from the left upper partial image, in this example, the defect 30 which is located in the recess 120 of the substrate 100 extends along an edge 32. The lower left partial image represents a sectional view 31 through the defect 30 along the dashed line 37. In the right upper partial image, the area 150 scanned by an AFM scan is indicated to determine a three-dimensional contour of the defect 30. During the measuring process, the tip of the AFM moves along the dashed lines of the area 150. As represented in the left lower partial image, the height of the surface of the absorber 110 is discriminated by means of a threshold value.

When an AFM determines the three-dimensional contour of the defect 30 along the edge 32, the above-mentioned principal measurement problems occur. The right lower partial image schematically shows the tip 160 of the AFM. The diameter of the tip 160 is not significantly smaller than the dimensions of the structures to be imaged. Additionally, the diameter extends along the longitudinal axis of the tip 160. Thus, inherent to its functional principle, an AFM can only image or represent structures realistically which do not exceed a certain aspect ratio (ratio between the depth or height of a structure and its smallest lateral extension). In an area along the edge 32, this aspect ratio is exceeded and the AFM cannot realistically reproduce the three-dimensional contour of the defect 30 in this area. As already mentioned, this situation can be improved by mathematical optimization methods; however, the measurement problem inherent to the functional principle of the AFM cannot be removed.

Figure 3:
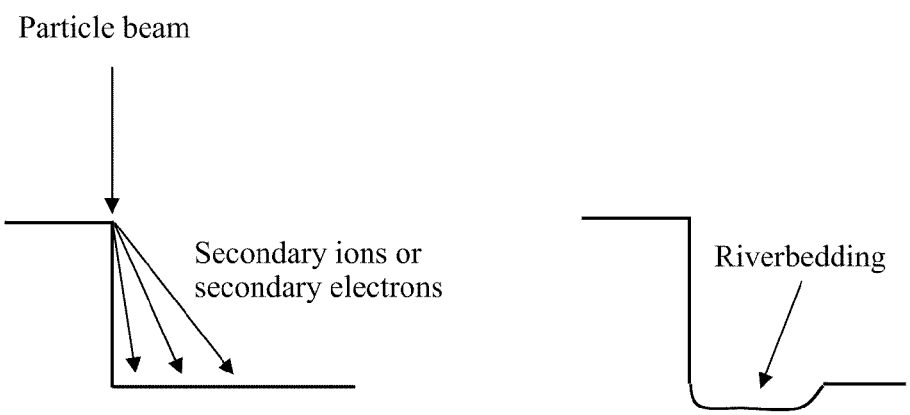
FIG. 3 shows a schematic representation of riverbedding caused by the emission of secondary electrons and secondary ions, respectively, at an edge of the photomask, according to one embodiment.

However, the precise determination of the shape of the defect 30 along the edge 32 of the recess 120 of the substrate 100 is decisive for its repairing. As schematically represented in FIG. 3, the particle beam used in the area of an edge for repairing a defect generates an enhanced emission rate of secondary electrons or secondary ions, which can lead to damages in the area exposed to secondary electrons or secondary ions in the recess 120 of the substrate 100, leading e.g. to the so-called "riverbedding". Therefore, the knowledge of the precise shape of the defect 30 along the edge 32 and in particular the shape of the edge 32 itself may be important for a repair with low secondary effects, since the edge causes the so-called "riverbedding" as has been already explained.

FIG. 4 schematically represents the three-dimensional contour 40 of the defect 30 determined from the AFM scan. The upper partial image shows a top view onto the three-dimensional contour 40 and the lower partial image represents a sectional view 41 through the contour 40 along the line 37. In FIG. 4, the neighboring absorbing structures 110 as well as the recess 120 of the substrate 100 are drawn in order to make clearer the position of the defect.

When comparing FIGS. 2 and 4, it can be seen that the three-dimensional contour 40 well represents the maximum extension of the defect 30 in the plane 190 at the bottom of the recess 120 of the substrate 100, i.e. its footprint. Likewise, the three-dimensional contour 40 well represents the height of the defect 30 in a certain minimal distance from the edge 32. On the other hand, the three-dimensional contour 40 does not well represent the surface of the defect along the edge 32. On the one hand, the coordinates of the footprint vary considerably along the edge 32 (upper partial image). On the other hand, the height of the contour 40 does not correlate well with the height of the defect 30 in this area, as can be seen from the cross-sectional view 41 at the position 37 (lower partial image).

FIG. 5 again repeats FIG. 2 with the difference that in FIG. 5 the area 170 which corresponds in its size to the area 150 of FIG. 2 has been scanned with a SEM (Scanning Electron Microscope) instead of an AFM (Atomic Force Microscope). As already mentioned above, the defect 30 can hardly be detected from a SEM scan since it has no material contrast. In addition, the defect 30 results in a topography contrast since it has in general no sharp boundaries.

In contrast, the edge 32 of the SEM scan can clearly be seen since it forms the boundary between two different materials: the chromium absorber 110 and the quartz substrate 100, as can for example be seen from FIG. 5. Therefore, the edge 32 may be defined in the SEM scan by a strong material contrast. Additionally, the edge 32 may provide a sharply limited step providing a topography contrast signal. Thus, the edge 32 can reliably be determined from the SEM scan.

FIG. 6 schematically presents the shape 50 of the edge 32 (upper partial image) determined from the SEM scan and a cross-sectional view 51 along the dashed line 37 (lower partial image). In order to illustrate the shape 50 of the edge 32, the adjacent absorber structures 110 as well as the recess 120 of the substrate 100 are indicated as dashed lines in FIG. 6.

In the example of FIG. 5, the SEM scan used for the determination of the shape 50 of the edge 32 has material contrast as well as topography contrast portions. However, it should be noted that this may not be required in embodiments described herein. In one embodiment, the shape of the edge 32 can be determined from the topography contrast data of a SEM scan. This means that it may not be necessary to have any chromium absorber structure 110 along the edge 32 of the recess 120 of the quartz substrate 100. Conversely, the shape 50 of the edge 32 can be determined from material contrast data of a SEM scan only.

FIG. 7 illustrates schematically how the repairing form 60 of the defect 30 is determined from the three-dimensional contour 40 and from the shape 50 of the edge 32 of the recess 120 of the substrate 100. For this purpose, the scale of the three-dimensional contour 40 is adjusted to the scale of the image 50 of the edge 32, if required. Then, the contour 40 is adjusted to the shape 50 of the edge 32. In the next step, the contour 40 is cut at the shape 50 of the edge 32. The shape 50 of the edge 32 forms the boundary of the repairing form 60 along the edge 32 of the recess 120 of the substrate 100. Therefore, the coordinates of the boundary of the repairing form 60 in the plane 190 (footprint of the repairing form 60) along the edge 32 originate from the SEM scan. The height data belonging to these coordinates are determined from the three-dimensional contour 40 of the AFM scan. The remaining data of the repairing form 60 are also determined from the three-dimensional contour 40.

In the example described in FIGS. 2 to 7, the repairing form 60 has discrete points in the plane 190 of the bottom of the recess 120 of the substrate 100 (footprint of the repairing form 60). A particle beam dose may be assigned to each of these individual points which may be necessary to remove the defect 30 at the respective position. In this process, the particle beam dose may be determined from the height of the three-dimensional contour 40 at this point. When the AFM scan and the SEM scan have the same step size and can be aligned perfectly relative to each other, the particle beam dose of the repairing form 60 may be proportional to the height of the three-dimensional contour 40 of the AFM scan at the individual scanning points. If the alignment of the two scans is not perfect, or if the step size of the two scans is not identical and in particular if the resolution of the AFM scan is different to the resolution of the SEM scan, the scanning points of the SEM scan may form the coordinates of the footprint of the repairing form 60. The particle beam dose of the individual points of the repairing form 60 may be determined by the interpolation of the height values belonging to several points of the three-dimensional contour 40.

FIGS. 8-10

The following FIGS. 8 to 10 illustrate another embodiment for determining a repairing form. Analogous to FIG. 2, FIG. 8 represents a cut-out of a photomask influencing the phase of optical radiation. As is shown in the left upper partial image, in this example, the defect 200 is located in the recess 220 of the substrate 100 and extends along the angled edge 232. The angled edges 232 have on both sides of the recess 220 an absorber structure 210. The left lower partial image represents a sectional drawing 231 through the defect 200 at the position marked by the dashed line 237. The area 300 shown in the right upper partial image which is scanned with an AFM scan as well as with a SEM scan in order to determine the three-dimensional contour of the defect 200. During the scanning process, the tip 160 of the AFM moves along the dashed lines across the area 300. The height of the surface of the absorber structure 210 is again detected by means of a threshold value (left lower partial image).

As for the defect 30, principle measurement difficulties occur when determining the three-dimensional contour of the defect 200 along the edge 232 when using an AFM. These problems have already been extensively discussed in the context of FIG. 2. For visualization purposes, the right lower partial image again schematically shows the problems of the tip 160 of the AFM. The aspect ratio is again too high along the edge 232 so that the AFM cannot realistically image the three-dimensional contour of the defect 200 in this area.

FIG. 9 schematically represents in the left upper partial image a top view of the three-dimensional contour 240 of the defect 200 determined from the AFM scan, and in the upper right partial image the shape 250 of the edge 232 determined from the SEM scan. In order to clarify the position of the defect 200 and the shape 250 of the edge 232, the adjacent absorber structures 210 as well as the edges 232 of the recess 210 of the substrate 100 are also indicated by dashed lines in FIG. 9. The lower partial images of FIG. 9 illustrate a sectional drawing 241 of the three-dimensional contour 240 of the defect 200 along the line 237 and a cross section 251 of the shape 250 of the edge 232. The three-dimensional contour 240 determined from the AFM scan faithfully represents the footprint of the defect 200 in the area limited by the substrate 100. However, if the edges 232 were not shown in FIG. 9, it would be difficult to determine the shape of the defect 200 along the edge 232 from the three-dimensional contour 240 only.

FIG. 10 again schematically illustrates the determination of the repairing form 260 of the defect 200 from the three-dimensional contour 240 and the shape 250 of the edges 232. For this purpose, if applicable after a rescaling, the contour 240 may be aligned with the shape 240 of the edges 232. Then, the contour 240 may be cut at the shape 250 of the edges 232. Again, the shape 250 of the edges 232 may form the boundary of the repairing form 260 along the edge 232 of the recess 220 of the substrate 100.

As already explained above, a realistic determination of the height of the defects 30, 200 is not possible in an area along the edges 32, 232 with the aid of an AFM scan. In a modification of the above described embodiments of the inventive method, it is thus possible to disregard this area when determining the particle beam dose of the repairing forms 60, 260.

In a further modification, the repairing forms 60, 260 can be reduced along the edges 32, 232 of the recesses 120, 220 of the substrate 100 of the photomask, so that they keep a minimal distance to each point of the edges 32, 232. Conversely, the repairing forms 60, 260 can be increased in such a way that they project a minimal length beyond the edges 32, 232 along the shapes of the edges 32, 232.

Furthermore, it is possible to combine a mathematical optimization method, such as the above mentioned of J. S. Villarubia, to improve the three-dimensional contours 40, 240 of an AFM scan with the methods described in this application (J. S. Villarubia, Algorithms for Scanned Probe Microscope Image Simulation, Surface and Reconstruction, J. Res. Natl. Inst. Stand. Technol. 102, 425, (1997), which is hereby incorporated by reference as if wholly and completely set forth herein).

Embodiments of the described method avoid the measurement problems of AFM scans in the area of large aspect ratios. Thus, the disclosed method enables the determination of a repairing form 60, 260 which realistically images the defect 30, 200 on which the repairing form 60, 260 is based. Repairing forms 60, 260 determined in this manner allow the repairing of defects 30, 200 on or in photomasks even along steep and high edges 32, 232 of the substrate 100, 200 of the photomask.

FIG. 11—Determining a Repairing Form of a Defect

FIG. 3 illustrates a method for determining a repairing form of a defect at or close to an edge of a substrate of a photomask. The method shown in FIG. 11 may be used in conjunction with any of the computer systems or devices shown in the above Figures, among other devices. In various embodiments, some of the method elements shown may be performed concurrently, in a different order than shown, or may be omitted. Additional method elements may also be performed as desired. As shown, this method may operate as follows.

In 1102, a defect may be scanned with a scanning probe microscope (e.g., an AFM) to determine a three-dimensional contour of the defect.

In 1104, the defect may be scanned with a scanning particle microscope (e.g., an SEM) to determine a shape of at least one edge of the substrate. For example, the shape of the edge may be determined from topography contrast data and/or the material contrast data of the scanning particle microscope scan In 1106, a repairing form of the defect may be determined from a combination of the three-dimensional contour and the shape of the at least one edge. In one embodiment, the determination may be based on a formation of an intersection from the combination of the three-dimensional contour and the shape of the edge. For example, the intersection may be formed by aligning the scanning probe microscope scan with the shape of the edge determined from the scanning particle microscope scan and cutting the scanning probe microscope scan with the shape of the edge.

The repairing form may include coordinates of the defects in a plane of its maximum extent which is perpendicular to the particle beam direction and a particle beam dose for repairing the defect. The repairing form may be divided in a number of discrete points and wherein each point comprises a particle beam dose, where the particle beam does is determined from data of the scanning probe microscope scan. In some embodiments, the particle beam dose of the individual points of the repairing form may be determined from an interpolation of several points of the scanning probe microscope scan.

The repairing form of the defect may be a minimal distance away from at least one edge of the photomask. Alternatively, the repairing form of the defect may project at least a minimal length beyond the photomask along at least one edge of the photomask.

Although the embodiments above have been described in considerable detail, numerous variations and modifications will become apparent to those skilled in the art once the above disclosure is fully appreciated. It is intended that the following claims be interpreted to embrace all such variations and modifications.

The invention claimed is:

1. A method for determining a repairing form of a defect at or close to an edge of a substrate of a photomask, comprising:
   scanning the defect with a scanning probe microscope to determine a three-dimensional contour of the defect;
   scanning the defect with a scanning particle microscope to determine a shape of at least one edge of the substrate;
   determining the repairing form of the defect from a combination of the three-dimensional contour and the shape of the at least one edge, wherein said determining comprises forming an intersection from the combination of the three-dimensional contour and the shape of the edge.

2. The method of claim 1, wherein the intersection is determined by aligning the scanning probe microscope scan with the shape of the edge determined from the scanning particle microscope scan and cutting the scanning probe microscope scan with the shape of the edge.

3. The method of claim 1, wherein the scanning probe microscope comprises an atomic force microscope.

4. The method of claim 1, wherein the scanning particle microscope comprises a scanning electron microscope.

5. The method of claim 1, further comprising:
determining the shape of the edge from topography contrast data and/or the material contrast data of the scanning particle microscope scan.

6. The method of claim 1, wherein the repairing form comprises coordinates of the defects in a plane of its maximum extent which is perpendicular to the particle beam direction and a particle beam dose for repairing the defect.

7. The method of claim 1, wherein the repairing form is divided in a number of discrete points and wherein each point comprises a particle beam dose, wherein the particle beam does is determined from data of the scanning probe microscope scan.

8. The method of claim 7, wherein the particle beam dose of the individual points of the repairing form is determined from an interpolation of several points of the scanning probe microscope scan.

9. The method of claim 1, wherein the repairing form of the defect is a minimal distance away from at least one edge of the photomask.

10. The method of claim 1, wherein the repairing form of the defect projects at least a minimal length beyond the photomask along at least one edge of the photomask.

11. The method of claim 1, further comprising:
repairing the defect using the repairing form.

12. An apparatus for determining a repairing form of a defect at or close to an edge of a substrate of a photomask, comprising:
at least one scanning probe microscope to scan the defect and to transmit scanned data;
at least one scanning particle microscope to scan the defect and to transmit scanned data; and
at least one data processing unit, wherein the data processing unit is configured to determine:
a three-dimensional contour of the defect from the data of the scanning probe microscope scan;
at least one edge of the substrate from the data of the scanning particle microscope scan; and
a repairing form of the defect from a combination of the three-dimensional contour and the shape of the at least one edge, wherein determining the repairing form comprises forming an intersection of the three-dimensional contour and the shape of the edge.

13. The apparatus of claim 12, wherein the intersection is determined by aligning the scanning probe microscope scan with the shape of the edge determined from the scanning particle microscope scan and cutting the scanning probe microscope scan with the shape of the edge.

14. The apparatus of claim 12, wherein the scanning probe microscope comprises an atomic force microscope.

15. The apparatus of claim 12, wherein the scanning particle microscope comprises a scanning electron microscope.

16. The apparatus of claim 12, wherein the at least one data processing unit is further configured to determine the shape of the edge from topography contrast data and/or the material contrast data of the scanning particle microscope scan.

17. The apparatus of claim 12, wherein the repairing form of the defect is a minimal distance away from at least one edge of the photomask.

18. The apparatus of claim 12, wherein the repairing form of the defect projects at least a minimal length beyond the photomask along at least one edge of the photomask.

* * * * *

UNITED STATES PATENT AND TRADEMARK OFFICE
CERTIFICATE OF CORRECTION

PATENT NO. : 8,316,698 B2
APPLICATION NO. : 12/640853
DATED : November 27, 2012
INVENTOR(S) : Michael Budach It is certified that error appears in the above-identified patent and that said Letters Patent is hereby corrected as shown below:

IN THE CLAIMS:

Column 11, Line 12, please delete "does" and substitute -- dose --.

Signed and Sealed this
Nineteenth Day of February, 2013

Teresa Stanek Rea
*Acting Director of the United States Patent and Trademark Office*